United States Patent

[11] 3,566,193

[72] Inventors Adam A. Jorgensen
Pittsford;
Robert William Bentley, Penfield; Edward Urycki, Buffalo, N.Y.

[21] Appl. No. 809,072
[22] Filed Mar. 21, 1969
[45] Patented Feb. 23, 1971
[73] Assignee Stromberg-Carlson Corporation
Rochester, N.Y.

[54] PRINTED CIRCUIT CARD ARRANGEMENT WITH SUPPORT FRAME AND SUPPORT ASSEMBLY
23 Claims, 7 Drawing Figs.

[52] U.S. Cl. ........................................................ 317/101
[51] Int. Cl. ........................................................ H05k 5/02,
H05k 5/04
[50] Field of Search ............................................ 317/99,
112, 120, 101 (OH,CW,CM,CB)

[56] References Cited

UNITED STATES PATENTS

| | | | |
|---|---|---|---|
| 3,360,689 | 12/1967 | Haury ........................... | 317/101 |
| 3,467,891 | 9/1969 | Mogle ........................... | 317/101 |
| 3,191,097 | 6/1965 | Dano ............................ | 317/101 |
| 3,200,361 | 8/1965 | Schwartz ........................ | 317/101 |

FOREIGN PATENTS

| | | | |
|---|---|---|---|
| 1,016,731 | 1/1966 | Great Britain ................ | 317/101 |

*Primary Examiner*—Laramie E. Askin
*Assistant Examiner*—Gerald P. Tolin
*Attorneys*—Craig Antonelli, Stewart and Hill and Charles C. Krawczyk

ABSTRACT: A printed circuit card arrangement including a printed circuit and a rigid frame secured thereto, and a module of printed circuit card arrangements supported on a gate in spaced parallel arrangement.

PATENTED FEB 23 1971

3,566,193

INVENTORS
A.A. JORGENSEN
R.W. BENTLEY
E. URYCKI

BY Craig, Antonelli, Stewart & Hill

ATTORNEYS

INVENTORS
A.A. JORGENSEN
R.W. BENTLEY
E. URYCKI
BY
ATTORNEYS

PRINTED CIRCUIT CARD ARRANGEMENT WITH SUPPORT FRAME AND SUPPORT ASSEMBLY

The present invention relates in general to printed circuit card arrangements and more particularly to a printed circuit card stiffener frame and guide pin arrangement associated with a printed circuit card module.

In an effort to reduce the size of complex electronic systems great attention has been focused through the years on the fabrication of printed circuit modules which may be physically mounted in closely spaced relationship to provide an extremely compact organization of plural circuits or systems. However, further efforts to additionally decrease the size of such modules have encountered difficulties with assembly of the printed circuit arrangements, alignment of the elements, proper registration between the printed circuit boards and associated connector elements, and proper spacing and insulation between the respective circuits, among the numerous difficulties.

Printed circuit card modules have been provided in numerous forms in an attempt to overcome the aforementioned difficulties and also be provide for accessibility and ease of repair of the individual circuits included in the arrangement. Arrangements such as the "Book-type" module wherein the boards are positioned in closely spaced relationship and hinged along a common edge so as to provide accessibility to the interior boards, much in the same manner as the pages of a book, have been developed to satisfy the requirement of accessibility. Other arrangements have provided both horizontal and vertical stacks of boards oriented through more or less complicated spacing and aligning elements so as to provide proper spacing and alignment between the respective boards and the associated electrical connector elements.

However, in spite of the progress that has been made over the years in connection with such printed circuit card modules, difficulties relating to interchangeability of individual boards so as to provide simplified circuit modification, simplified assembly and disassembly for purposes of initial manufacture and subsequent repair, and accuracy in alignment between the respective boards and registration between the boards and the associated connector elements have proven to be ever present problems.

Accordingly, the present invention provides a printed circuit card stiffener frame and guide pin arrangement in association with a printed circuit card module which tends to more closely achieve the aforementioned objectives than those arrangements of a similar nature which have been provided heretofore.

In addition, the objects of the present invention are achieved most notably with relatively simple means which provide for economy of manufacture, simplicity of assembly and dependability in use.

In accordance with the present invention there is provided a printed circuit card module wherein printed circuit cards of varying lengths may be selectively combined to produce a stack of equally spaced parallel vertically disposed card assemblies. The card assemblies include a printed circuit card bounded by a framework of stiffening members which add rigidity to the card during the handling and assembling, with oppositely disposed side frame members forming a guide pin arrangement for supporting the card in conjunction with a support frame or gate.

One important feature of the present invention relates to a stiffener frame for a printed circuit card, which frame is composed of rigid metal frame elements bounding the card on all sides and providing a rigidity thereto which permits extremely close spacing between the card assemblies while assuring proper alignment of the cards in the overall module. One frame element forming the front stiffening member for the card serves also as a designation strip holder and support surface for lamps, switches, test jacks, potentiometers, etc. which may be mounted to or projected through cutouts after the components have been fixed to the printed circuit card. This frame element may also provide a front projecting flange that serves as a handle to facilitate the installation or the removal of the card from the gate assembly.

An especially important feature of the present invention resides in provision of side frame elements for the printed circuit card which include a captive male screw stud encased in such a manner as to engage upper and lower female guide studs supported on the mounting gate or shelf frame upon which the cards are supported in the gate assembly. Channels in the upper and lower side frame elements permit insertion of a screwdriver to effect engagement between the male screw stud and the female guide stud which not only provides for locking of the circuit card to the frame or gate, but also effects an engagement, and in the reverse operation a disengagement, of the circuit card connector element with the accompanying connector element mounted on the frame or gate.

These and other features and advantages of the present invention will become more apparent from the following detailed description thereof when taken in conjunction with the accompanying drawings, which illustrated one exemplary embodiment of the present invention, and wherein.

For purposes of providing a complete disclosure of the present invention, an exemplary embodiment thereof will now be set forth in detail; however, it should be understood that various modifications and changes in the construction and arrangement of elements may be effected in an obvious manner by one of ordinary skill in the art without departing from the spirit and scope of the invention.

Figures 1, 6, 7:
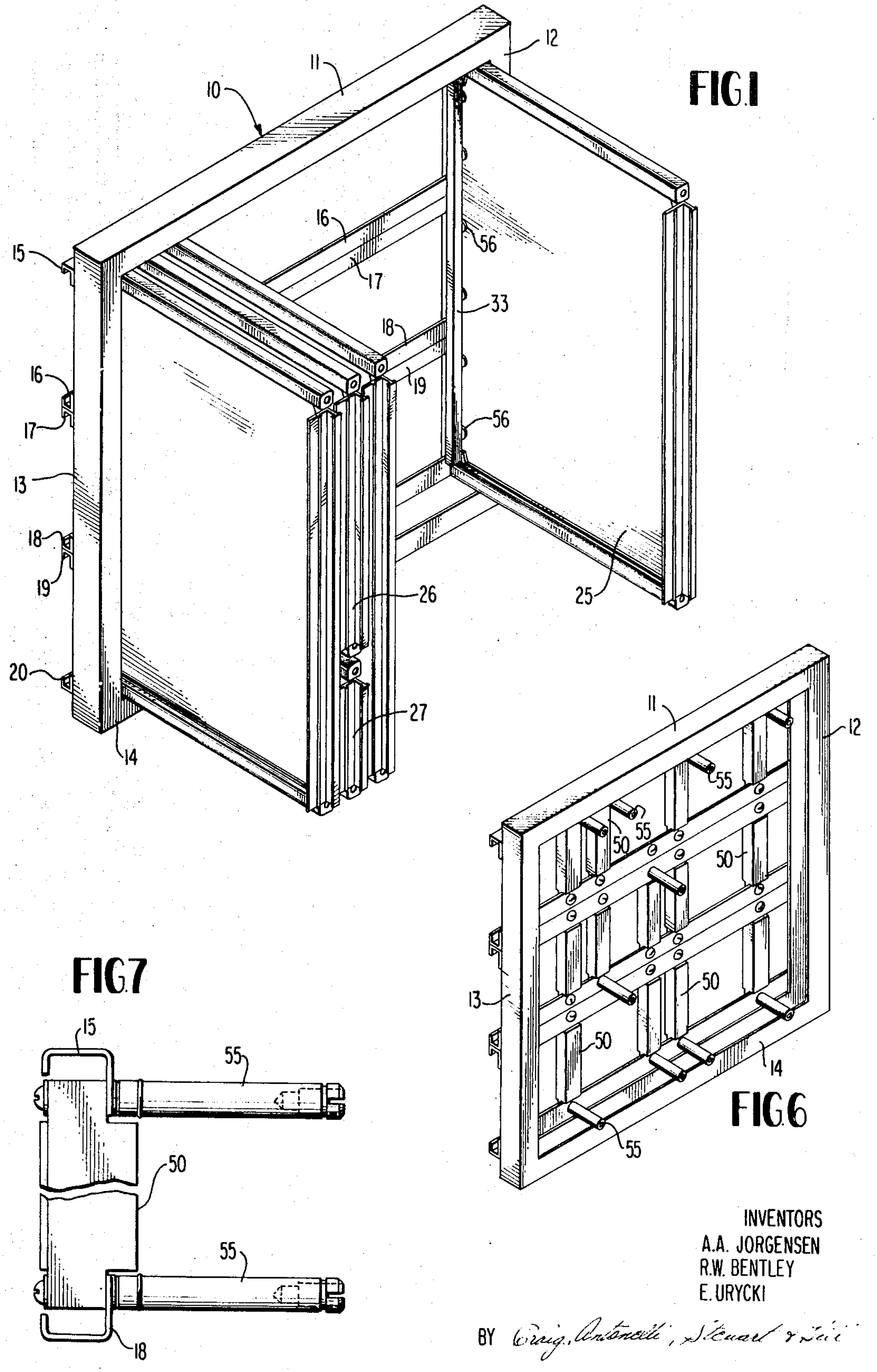
FIG. 1 is a general perspective view showing the gage assembly of printed circuit cards as provided in accordance with the present invention.
FIG. 6 is a detailed illustration of the gate upon which the individual printed circuit card assemblies are mounted.
FIG. 7 is a detailed illustration of the connector and guide stud arrangement provided on the gate assembly.
Figure 2:
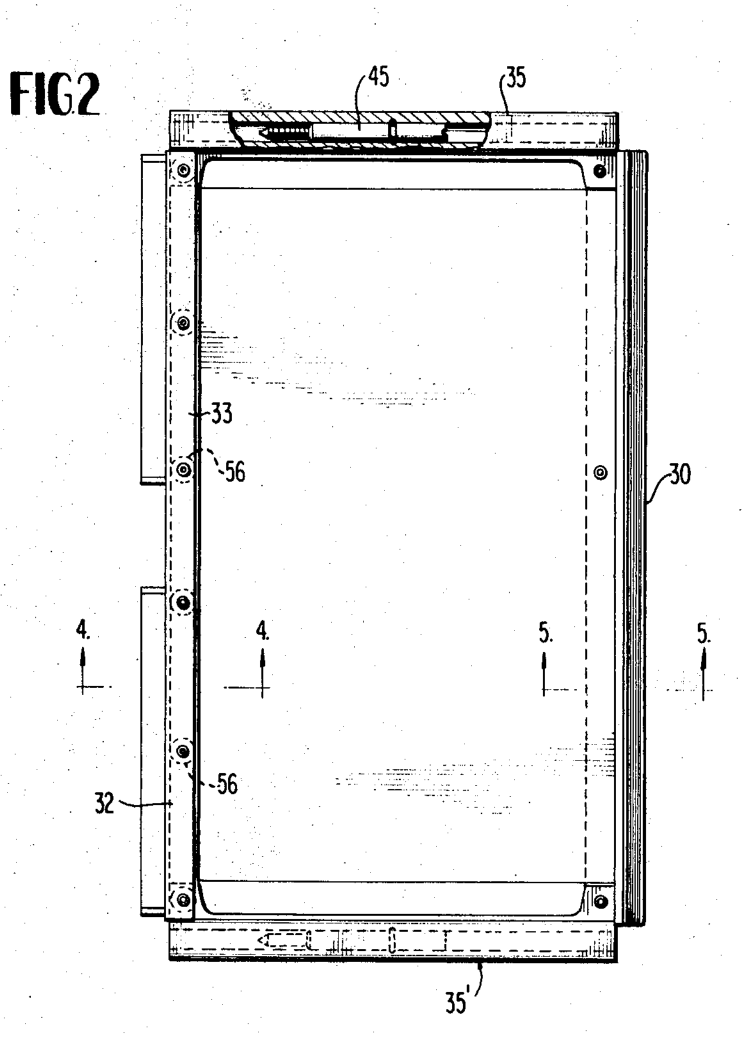
FIG. 2 is a top plan view of a typical printed circuit card assembly in accordance with the present invention.

FIG. 1 provides a general view of the gate assembly in accordance with the present invention illustrating the versatile use of printed circuit cards of varying length to provide a module arrangement of circuits in a compact assembly. The gate or shelf is generally designated at 10 as being substantially rectangular in configuration and having respective side portions 11, 12, 13, & 14. In addition, connector mounting bars 15—20 are secured to the rectangular gate, serving as support elements for the connectors and guide studs, and will be described in greater detail hereinafter.

The printed circuit card assemblies are supported on the gate or shelf in a vertical closely spaced parallel relationship so as to provide a stack or block of printed circuit cards in an assembly. As apparent from FIG. 1, due to the presence of the mounting bars, such as 16 and 17, at intermediate positions between the end gate elements 11 and 14, it is possible to support printed circuit cards of intermediate length at the gate or shelf pin. For example, while the printed circuit card 25 is of full length extending all the way between the opposite gate elements 11 and 14, the printed circuit card 26 is only two-thirds of full length being supported between the mounting bars 11 and 18. In a like manner, the circuit card 27 provides only one-third of the full circuit card length, being supported between the mounting bars 19 and 20. In this way, many combinations of circuit cards of varying length may be supported in the modular assembly so as to provide for separation of the circuit subassemblies and replacement of circuit cards with one or more cards of different size in a relatively simple manner.

Looking now more closely to FIGS. 2, 3, 4 and 5, the printed circuit card stiffener frame in accordance with the present invention consists of a front frame member 30, a rear frame member 32 and upper and lower frame members 35 and 35'. The frame members 30, 32, 35 and 35' are secured to one another and to the printed circuit card so as to form a rigid frame completely surrounding the card. The individual frame members, which may consist of extruded aluminum sections, are attached in a predetermined fashion to the printed circuit card through the use of metal rivets or other known fastener elements.

Figure 3:
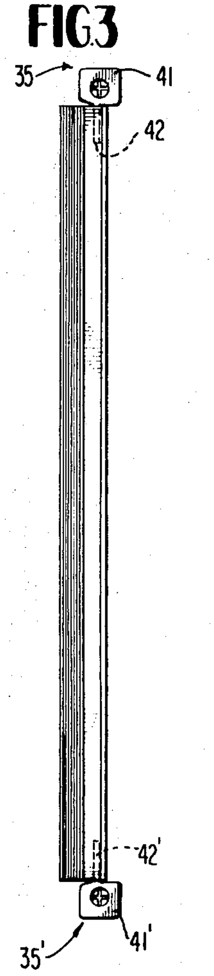
FIG. 3 is a side view of the printed circuit card assembly of FIG. 2.

The side view of the printed circuit card arrangement illustrated in FIG. 3 shows the configuration of the upper and lower frame members 35 and 35', which are essentially identical in configuration. These frame members consist of a substantially rectangular hollow channel portion 41 and an integral transversely extending stiffener or support portion 42 which is secured directly to the printed circuit card by way of rivets or other suitable fastening means 52. The support portions 42 and 42' of the frame members 35 and 35' are provided in the form of projections at the respective ends of the frame member so as to provide for a securing of the hollow channel portions 41 and 41' to the printed circuit card. Within the hollow of the channel portions 41 and 41' there is provided a captive male screw stud 45 incased in the hollow channel portion with a washer or key preventing longitudinal translation of the screw stud while permitting rotation thereof. Thus, the printed circuit card assembly can be mounted on a gate or other support by sliding the upper and lower channel sections 50 onto suitable guide studs, in a manner to be described in greater detail hereinafter.

Figure 5:
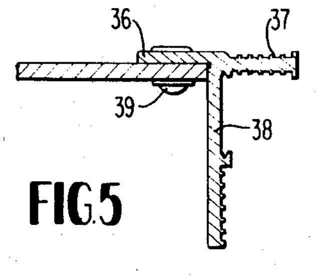
FIG. 5 is a section of the printed circuit card assembly taken along line 5—5 of FIG. 2.

FIG. 5 illustrates in detail a section of the front frame member 30 which includes a support extension 36, a forwardly extending handle portion 37, and a transversely extending designation strip portion 38. The support extension 36 is secured directly to the printed circuit card by way of a rivet or other fastener 39 so that the handle portion 37 projects forwardly providing a means for gripping a circuit card to remove or place the card in position in the printed module. The transversely extending designation strip portion 38 provides a surface for lamps, switches, test jacks, potentiometers, etc. to either be mounted to or project through after these components have been fixed to the printed circuit card.

Figure 4:
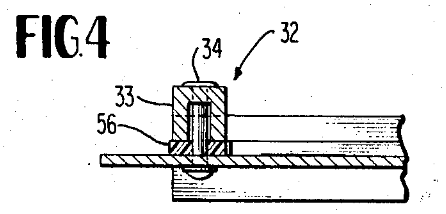
FIG. 4 is a section of the printed circuit card assembly taken along line 4—4 of FIG. 2.

FIG. 4 illustrates a section of the rear frame member 32 which consists of a U-shaped channel 33 mounted with the legs engaging a plurality of insulating washers or spacers 56 that space the channel 33 from the conductors on the printed circuit board and secured thereto by means of a rivet or other fastener 34 extending through the board and the washer 56 from the base portion of the channel member. As noted in the FIG., a portion of the circuit board extends beyond the frame member 32, and this section preferably provides the contacts which are inserted into the female connector strips mounted in the gate or shelf assembly. Due to the particular U-shaped configuration of the frame member 32, the edge of the printed circuit card which is to be inserted into the female connector strips is supported with extreme rigidity so as to prevent flexing of the cards which might in some way provide for difficulty in alignment between the contacts on the printed circuit card and the connector strip arrangement.

The gate or shelf which provides for support of the printed circuit assembly and the manner of support of the individual boards thereon is illustrated in greater detail in FIG. 6. The connector mounting bars 15—20 are each provided with apertures along the length thereof which are aligned in the vertical direction so as to accommodate the fasteners for individual plug-in-type connectors 50 which are supported vertically in the frame to receive the terminal edge of associated printed circuit cards. The connectors 50 will locate precisely on the gate between the punched connector mounting bars in accordance with the desired size and location of the various printed circuit cards to be mounted in the module, which connectors are then secured in place by suitable fasteners. Also secured to the connector mounting bars 15—20 are the plurality of female guide studs 55 positioned at the ends of a connector strip, or row of connector strips depending on the size of the cards to be mounted in position thereat. These guide studs 55 also cooperate with the fastener for the connector strip to thereby provide the means for holding the connector strip on the connector mounting bar as seen in FIG. 7. The female guide studs 55 are provided in locations representing the upper and lower edges of the individual printed circuit cards to be mounted on the gate 10, and as already described cooperate with the channels in the frame members 35 and 35' to support the individual card assemblies at the respective upper and lower horizontal edges thereof. Thus, these female guide studs will properly locate the various printed circuit cards and support the cards in spaced parallel relationship. As seen in FIG. 7, the guide studs 55 are provided with a female threaded portion at both ends thereof with one end corporating with the fastener for the connector element to secure the connector element to the connector mounting bar. The free end of the guide stud also is provided with a female threaded portion to accommodate a securing member mounted in the printed circuit card frame.

In assembling the cards on the gate or frame the printed card assembly is supported with a pair of guide studs 55 inserted into the channels of the upper and lower frame members 35 and 35' of the card, which is then physically pushed in until the end of captive screw 45 butts against the female threaded portion of the locating guide stud 55 secured on the gate. A hand screwdriver or similar device is then used to engage the male and female threads which will draw the card, through the use of the captive screw stud, into its home position in engagement with the fixed connectors 50. In the same manner, the cards can be easily extracted from their seated position thereby eliminating the use of intricate card extractor tools or brute force to engage or disengage the card. The use of a threaded connection between the printed card assembly and the mounting frame or gate adds a rigidity to the entire module and insures proper location of each printed circuit guide at all times in the required connector element.

In addition, since the guide studs 55 are precision located on the mounting gate or shelf frame, the position of these guide studs being directly relation to the printed circuit card connectors by means of the connector mounting holes, accurate location of the cards in relation to the connectors in ensured. The location of these studs will be predetermined in such a manner as to facilitate mounting the various multiple or individual cards in a mixed configuration with the precision required to maintain the necessary close spacing between the various cards of the module.

We claim:

1. A printed circuit card arrangement comprising:
   - a printed circuit card for carrying a printed circuit and electrical components connected thereto and having a plurality of contacts along an end of said card;
   - a stiffener frame forming a rigid frame fastened to said card for rendering said card substantially inflexible wherein said plurality of contacts extend beyond said frame; and
   - two opposite sides of said frame are substantially parallel to the plane of said printed circuit card and have an end adjacent said card end having contacts, wherein each side includes a substantially tubular support portion formed with an elongated opening extending into said support portion from the end of the support portion located adjacent said card end defining a pair of parallel tubular guides for mounting said board.

2. A printed circuit card arrangement as defined in claim 1, wherein said stiffener frame is made up of first, second, third and fourth side frame members secured to one another to form a substantially rectangular frame.

3. A printed circuit card arrangement as defined in claim 2, wherein the first frame member is provided in the form of a substantially U-shaped channel extending along one side of the card adjacent the end of said card having said plurality of contacts; and insulating spacer means interposed between said U-shaped frame member and said card to effect electrical insulation therebetween.

4. A printed circuit card arrangement as defined in claim 3, wherein the second frame member is provided with a stiffener portion secured to said card along another edge thereof and an oppositely extending handle portion and insulating spacer means interposed between said stiffener portion and said card to effect electrical insulation therebetween.

5. A printed circuit card arrangement as defined in claim 4, wherein said second frame member additionally includes a further portion extending transversely to said stiffener portion and said handle portion and said card for carrying indicating elements thereon.

6. A printed circuit card aRrangement as defined in claim 3, wherein said second frame member is provided with a stiffener portion in contact with said card along an edge thereof and a handle portion integrally connected to said stiffener portion.

7. A printed circuit card arrangement as defined in claim 2, wherein third and fourth frame members are provided in the form of a substantially tubular support portion having a flange portion extending therefrom into contact with said card.

8. A printed circuit card arrangement as defined in claim 7, wherein said third and fourth frame members include fastener means mounted within said tubular support portions for supporting said card in a modular arrangement.

9. A modular arrangement of printed circuit cards supported in a spaced parallel relationship comprising:

- a plurality of printed circuit card arrangements, each including a printed circuit card and a stiffener frame in the form of a rigid frame secured to said card;
- a supporting gate for supporting said printed circuit card arrangements;
- a plurality of supporting guide studs secured to said gate at prescribed locations determined by the size of said printed circuit card arrangement; and
- substantially tubular engaging means forming part of said stiffener frame on each printed circuit card arrangement wherein said engaging means includes a pair of parallel tubular guideways engaging respective supporting guide studs to mount said card arrangements on said supporting gate.

10. A modular arrangement as defined in claim 9, wherein a fourth frame member is provided with a stiffener portion secured to said card along an edge thereof and an oppositely extending handle portion.

11. A modular arrangement as defined in claim 10, wherein fourth said frame member additionally includes a further portion extending transversely to said stiffener portion and said handle portion and said card for carrying indicating elements thereon.

12. A modular arrangement as defined in claim 9, wherein said stiffener frame is made up of at least first, second and third side frame members secured to one another to form a substantially rectangular frame.

13. A modular arrangement as defined in claim 12, wherein each stiffener frame includes first and second frame members each provided in the form of a substantially tubular support portion forming part of said engaging means and each said first and second members having a flange portion extending therefrom into contact with said card.

14. A modular arrangement as defined in claim 13, wherein a frame member is provided with a stiffener portion in contact with said card along an edge thereof and a handle portion integrally connected to said stiffener portion.

15. A modular arrangement as defined in claim 9, wherein said guide studs are slideable disposed in said guideways of each said stiffener frame, said engaging means further including a captive male fastener and said guide studs having a female fastener portion capable of engagement with said captive male fastener.

16. A modular arrangement as defined in claim 13, wherein said first and second frame members include fastener means mounted within said tubular support portions.

17. A modular arrangement as defined in claim 16, wherein said fastener means includes a captive threaded fastener having a male engaging portion, said guide studs being provided with a female engaging portion operatively coupling with said male engaging portion to lock said card arrangement to said gate.

18. A modular arrangement as defined in claim 9, wherein said supporting gate includes a plurality of spaced parallel connector mounting bars extending transversely to the planes of said printed circuit card arrangements and means for mounting a plurality of female electrical connectors on pairs of said mounting bars substantially transverse thereto and for supporting said guide studs on said mounting bars so as to support said card arrangements in position for engagement with respective electrical connectors.

19. A modular arrangement as defined in claim 18, wherein said printed circuit card arrangements in different sizes are positionable in the same plane transversely to said supporting gate.

20. A modular arrangement as defined in claim 12, wherein the third frame member is provided in the form of a substantially U-shaped channel extending along one edge of the card and insulating spacer means interposed between said third frame member and said card to effect electrical insulation therebetween.

21. A printed circuit card assembly comprising:

- a printed circuit card having at least one contact portion;
- a stiffener frame means attached to said printed circuit card adjacent edges of said card for rendering said card substantially inflexible;
- a support structure having at least one printed circuit card connector mounted thereon, said connector receiving said at least one contact portion;
- a plurality of spaced elongated elements connected to said support structure and projecting outward from the plane of said support structure;
- first and second opposing sides of said frame means each being formed with an elongated opening for receiving and substantially enveloping a respective elongated element; and
- a third side of said frame means having a handle portion for placing said first and second sides of said frame means into engagement with respective ones of said elements and inserting said at least one contact portion of said card into said respective connector.

22. A printed circuit card assembly as set forth in claim 21 and including means fixed to said support structure for spacing said elongated elements and a plurality of said connectors on said support structure to accommodate a plurality of frames of different sizes in a spaced parallel array.

23. A printed circuit card assembly as set forth in claim 21 wherein said first and second sides of said frame means each has formed therein an elongated opening having substantially the same cross-sectional dimension as a respective elongated element for at least the length of said respective elongated element, so that said respective elongated element is substantially enveloped by the respective frame side when said contact portion of said card is inserted into said connector.